(12) United States Patent
Wang et al.

(10) Patent No.: US 11,073,427 B2
(45) Date of Patent: Jul. 27, 2021

(54) WAVEFRONT SENSOR AND METHOD OF RECONSTRUCTING DISTORTED WAVEFRONTS

(71) Applicant: King Abdullah University of Science and Technology, Thuwal (SA)

(72) Inventors: Congli Wang, Thuwal (SA); Xiong Dun, Thuwal (SA); Qiang Fu, Shanghai (CN); Wolfgang Heidrich, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 83 days.

(21) Appl. No.: 16/346,773

(22) PCT Filed: Oct. 26, 2017

(86) PCT No.: PCT/IB2017/056671
§ 371 (c)(1),
(2) Date: May 1, 2019

(87) PCT Pub. No.: WO2018/083573
PCT Pub. Date: May 11, 2018

(65) Prior Publication Data
US 2019/0265107 A1 Aug. 29, 2019

Related U.S. Application Data

(60) Provisional application No. 62/415,829, filed on Nov. 1, 2016.

(51) Int. Cl.
G01J 9/02 (2006.01)
G03F 7/00 (2006.01)
G01J 9/00 (2006.01)

(52) U.S. Cl.
CPC . *G01J 9/02* (2013.01); *G01J 9/00* (2013.01); *G01J 9/0215* (2013.01); *G03F 7/001* (2013.01); *G01J 2009/002* (2013.01)

(58) Field of Classification Search
None
See application file for complete search history.

(56) References Cited

U.S. PATENT DOCUMENTS

| 6,570,143 B1 * | 5/2003 | Neil | G01J 9/00 250/201.9 |
| 10,673,525 B2 * | 6/2020 | Boruah | H04B 10/697 |
| 2020/0278257 A1 * | 9/2020 | Berlatzky | G01J 9/02 |

FOREIGN PATENT DOCUMENTS

| CN | 105115417 A | 12/2015 |
| WO | 200017612 A1 | 3/2000 |

OTHER PUBLICATIONS

Google translation of CN105115417.*
(Continued)

*Primary Examiner* — Shawn Decenzo
(74) *Attorney, Agent, or Firm* — Billion & Armitage

(57) ABSTRACT

A wavefront sensor includes a mask and a sensor utilized to capture a diffraction pattern generated by light incident to the mask. A reference image is captured in response to a plane wavefront incident on the mask, and another measurement image is captured in response to a distorted wavefront incident on the mask. The distorted wavefront is reconstructed based on differences between the reference image and the measurement image.

6 Claims, 6 Drawing Sheets

(56) References Cited

OTHER PUBLICATIONS

Notification of Transmittal of the International Search Report and the Written Opinion of the International Searching Authority, or the Declaration for PCT/IB2017/056671 dated Mar. 29, 2018.
"Semiconductor Lithography(Photolithography)—The Basic Process", Nov. 17, 2017.
"2.5.1 Contact and Proximity Printing", Retrieved from the Internet: URL:htt;://www.iue.tuwien.ac.at/phd/kirchauer/node26.html, whole document, Apr. 17, 1998.
Shack, et al., Shack-Hartmann Wavefront Sensors, 2019, 12 pages.
Tyson, Principles of Adaptive Optics Third Edition, CRC Press, Taylor & Francis Group, 2011, 310 pages.
Ragazzoni, Pupil Plane Wavefront Sensing With an Oscillating Prism, Journal of Modern Optics, vol. 43, Issue 2, 1996, pp. 289-293.
Waller, et al., Transport of Intensity Phase-amplitude Imaging With Higher Order Intensity Derivatives, Optics Express, vol. 18, No. 12, Jun. 7, 2010, 10 pages.
Hudgin, Wave-Front Reconstruction for Compensated Imaging, Journal of the Optical Society of America, vol. 67, No. 3, Mar. 1977, 4 pages.
Noll, Phase Estimates From Slope-type Wave-front Sensors, Journal of the Optical Society of America, vol. 68, No. 1, Jan. 1978, 2 pages.
Roddier, Wavefront Reconstruction Using Iterative Fourier Transforms, Applied Optics, vol. 30, No. 11, Apr. 10, 1991, 3 pages.
Gilles, et al., Multigrid Preconditioned Conjugate-gradient Method for Large-scale Wave-front Reconstruction, Optical Society of America, vol. 19, No. 9, Sep. 2002, 6 pages.
Bon, et al., Noniterative Boundary-Artifact-Free Wavefront Reconstruction From Its Derivatives, Applied Optics, vol. 51, No. 23, Aug. 10, 2012, 7 pages.
Zuo, et al., Boundary-artifact-free Phase Retrieval with the Transport of Intensity Equation: Fast Solution With Use of Discrete Cosine Transform, Optics Express, vol. 22, No. 8, Apr. 21, 2014, 25 pages.
Ng, et al., Light Field Photography with a Hand-held Plenoptic Camera, Stanford Tech Report, CTSR, 2005, 11 pages.
Xu, et al., High-resolution Lightfield Photography Using Two Masks, Optics Express, vol. 20, No. 10, May 7, 2012, 13 pages.
Lalor, Conditions for the Validity of the Angular Spectrum of Plane Waves, Journal of the Optical Society of America, vol. 58, No. 9, Sep. 1968, 3 pages.
Streibl, Phase Imaging by the Transport Equation of Intensity, Optics Communications, vol. 49, No. 1, Feb. 1, 1984, 5 pages.
Parikh, et al., Proximal Algorithms, Foundations and TrendsR in Optimization, vol. 1, Issue 3, 2014, 30 pages.
Rockafellar, Augmented Lagrangians and Applications of the Proximal Point Algorithm in Convex Programming, Mathematics of Operations Research, vol. 1, No. 2, May 1976, 20 pages.
Bruck Jr., An Iterative Solution of a Variational Inequality for Certain Monotone Operators in Hilbert Space, American Mathematical Society, vol. 81, No. 5, Sep. 1975, 3 pages.
Chambolle, et al., A First-Order Primal-Dual Algorithm for Convex Problems with Applications to Imaging, Journal of Mathematical Imaging and Vision, vol. 40, 2011, pp. 120-145.
Goldstein, et al., The Split Bregman Method for L1-Regularized Problems, Society for Industrial and Applied Mathematics, vol. 2, No. 2, 2009, pp. 323-343.
Daubechies, et al., An Iterative Thresholding Algorithm for Linear Inverse Problems with a Sparsity Constraint, Communications on Pure and Applied Mathematics, vol. LVII, 2004, pp. 1413-1457.
Beck, et al., A Fast Iterative Shrinkage-Thresholding Algorithm for Linear Inverse Problems, Society for Industrial and Applied Mathematics, vol. 2, No. 1, 2009, pp. 183-202.
Geman, et al., Nonlinear Image Recovery with Half-Quadratic Regularization, IEEE Transactions on Image Processing, vol. 4, Issue 7, Jul. 1993, 31 pages.
Komodakis, et al., Playing with Duality, IEEE Signal Processing Magazine, Nov. 2015, pp. 31-54.
Li, et al., A New Median Formula With Applications to Pde Based Denoising, Communications in Mathematical Sciences, vol. 7, No. 3, 2009, pp. 741-753.
Platt, et al., History and Principles of Shack-Hartmann Wavefront Sensing, Journal of Refractive Surgery, vol. 17, Sep./Oct. 2001, pp. S573-S577.
Roddier, Curvature Sensing and Compensation: A New Concept in Adaptive Optics, Applied Optics, vol. 27, No. 7, Apr. 1, 1988, pp. 1223-1225.
Richard, et al., Principle and Applications of the Background Oriented Schlieren (BOS) Method, Measurement Science Technology, vol. 12, 2001, pp. 1576-1585.
Wetzstein, et al., Hand-Held Schlieren Photography with Light Field Probes, The University of British Columbia, 2011, 8 pages.
Veeraraghavan, Dappled Photography: Mask Enhanced Cameras for Heterodyned Light Fields and Coded Aperture Refocusing, Mitsubishi Electric Research Laboratories, Jul. 2007, 14 pages.
Marwah, et al., Compressive Light Field Photography using Overcomplete Dictionaries and Optimized Projections, ACM Transactions on Graphics, vol. 32, No. 4, Article 46, Jul. 2013, 12 pages.
Asif, et al., FlatCam: Thin, Lensless Cameras Using Coded Aperture and Computation, IEEE Transactions on Computational Imaging, vol. 3, No. 3, Sep. 2017, pp. 384-397.
Horisaki et al., Experimental Demonstration of Single-shot Phase Imaging With a Coded Aperture, Optics Express, vol. 23, No. 22, Oct. 23, 2015, 7 pages.
Teague, Deterministic Phase Retrieval: A Green's Function Solution, Journal Optical Society of America, vol. 73, No. 11, Nov. 1983, pp. 1434-1441.
Horn, et al., Determining Optical Flow, Artificial Intelligence, vol. 17, Issues 1-3, Apr. 1980, 28 pages.
Boyd, et al., Distributed Optimization and Statistical Learning via the Alternating Direction Method of Multipliers, Foundations and Trends in Machine Learning, vol. 3, Issue 1, 2010, 26 pages.
Almeida, et al., Frame-based Image Deblurring With Unknown Boundary Conditions Using the Alternating Direction Method of Multipliers, ICIP International Conference on Image Processing, 2013, pp. 582-585.
Almeida, et al., Deconvolving Images With Unknown Boundaries Using the Alternating Direction Method of Multipliers, IEEE Transactions on Image Processing, vol. 22, No. 8, Aug. 2013, pp. 3074-3086.
Atcheson, et al., An Evaluation of Optical Flow Algorithms for Background Oriented Schlieren Imaging, Experiment in Fluids, vol. 46, 2009, pp. 467-476.
Brox, et al., High Accuracy Optical Flow Estimation Based on a Theory for Warping, ECCV, LNCS 3024, 2004, pp. 25-36.
Heide, et al., ProxlmaL: Efficient Image Optimization using Proximal Algorithms, ACM Trans. Graph., vol. 35, No. 4, Article 84, Jul. 2016, 15 pages.
Regan-Kelley, et al., Halide: A Language and Compiler for Optimizing Parallelism, Locality, and Recomputation in Image Processing Pipelines, Association for Computing Machinery (ACM), ISSN 03621340, Jun. 16-19, 2013, pp. 519-530.
Atcheson, Time-resolved 3D Capture of Non-stationary Gas Flows ACM Transactions on Graphics, vol. 27, No. 5, Article 132, Dec. 2008, 10 pages.

* cited by examiner

WAVEFRONT SENSOR AND METHOD OF RECONSTRUCTING DISTORTED WAVEFRONTS

TECHNICAL FIELD

The present disclosure is related generally to wavefront sensors, and in particular to modulated wavefront sensors.

BACKGROUND

A wavefront sensor is a device utilized to measure aberrations in an optical wavefront. Wavefront sensors are utilized in a number of applications, including in fields of adaptive optics, ophthalmology, etc. For example, an adaptive optics device measures the aberrations in the optical wavefront and then corrects the aberrations such that the light provided to a measuring device (e.g., telescope) is collimated.

Current wavefront sensors are typically described as a Shack-Hartmann type sensor, which is a first-order method utilized to detect wavefront slopes, and a curvature sensing type, which is a second order method. With respect to the Shack-Hartman wavefront sensor, this type of wavefront sensor utilizes an array of lenses that focus an incoming wavefront onto a sensor—such as a CCD array or CMOS array sensor. If the wavefront is planar (i.e., does not have any aberrations) then the spots or points of light focused by each lenslet show no displacement, i.e. the spots locate at the center. If the wavefront is not planar, then the local slope of the wavefront at each particular lenslet results in a proportional displacement of the spot focused on the sensor, compared to the spots of planar wavefront.

However, the Shack-Hartmann type wavefront sensor suffers from several drawbacks, including poor resolution, and poor pixel utilization. For example, the resolution of the Shack-Hartmann type wavefront sensor is largely dependent on the number of lenslets in the microlens array. The maximum wavefront resolution depends on the number of lenslets in the microlens array, and its sampling period is the inverse of the spacing between two neighboring lenslets, which prevents high resolution wavefront slope detection. Therefore, it would be beneficial to introduce a wavefront sensor that cures these deficiencies.

DETAILED DESCRIPTION

The present invention provides a wavefront sensor utilized to measure the phase of distorted wavefronts. In one embodiment, the wavefront sensor—described herein as a Coded Shack-Hartmann (CSH) wavefront sensor—utilizes a foreground mask that modulates the incoming wavefront at diffraction scale. The resulting wavefront information is encoded in the diffraction pattern, and is numerically decoded by a wavefront reconstruction algorithm that relies on a simple optimization method. In this way, the CSH wavefront sensor provides higher pixel utilization, full sensor resolution wavefront reconstruction, and efficient parallel computation and real-time performance as compared with traditional wavefront sensors such as the traditional Shack-Hartmann wavefront sensor.

Figure 1:
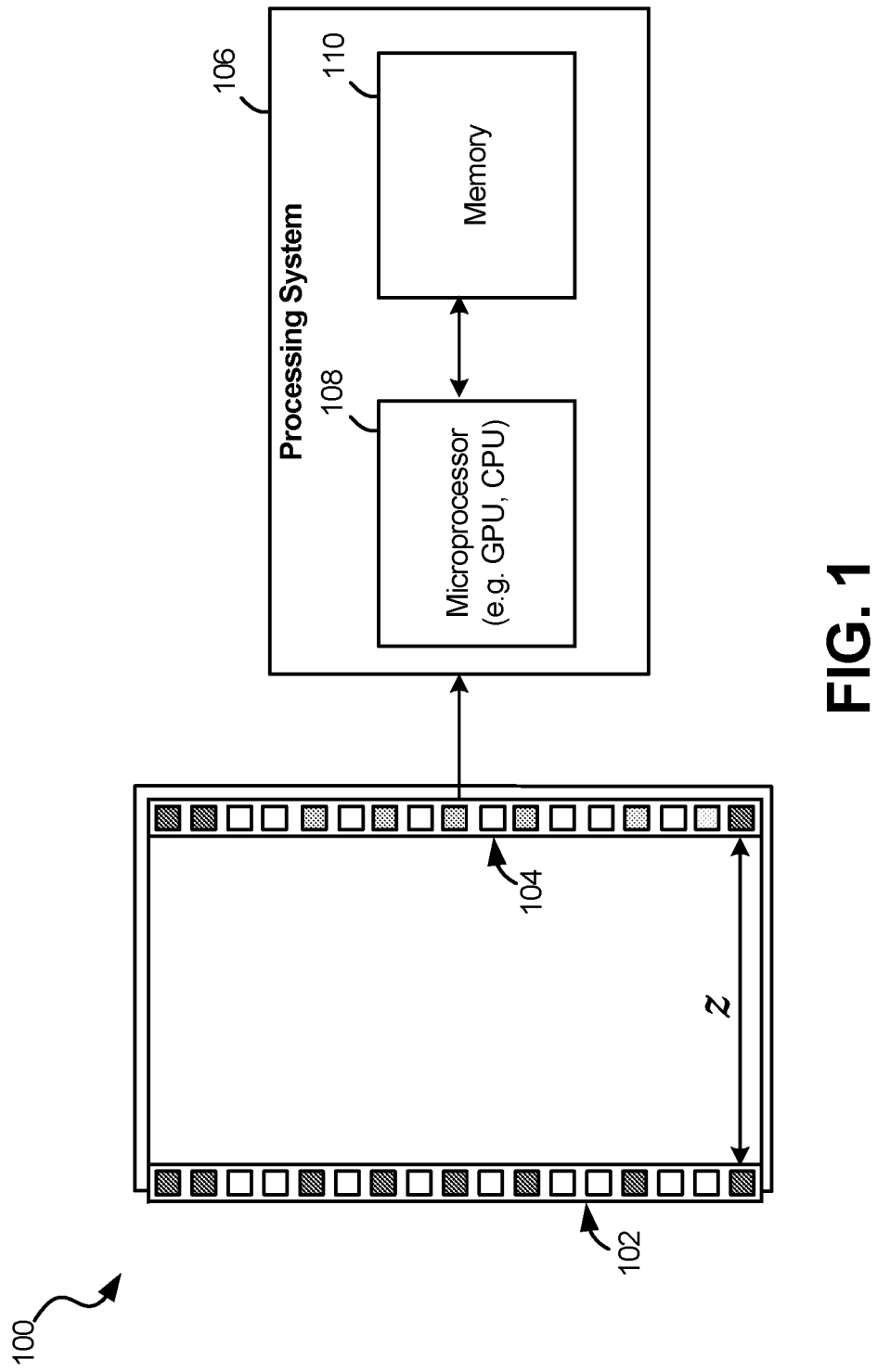
FIG. 1 a block diagram of a Coded Shack-Hartmann (CSH) wavefront sensor according to an embodiment of the present invention.

FIG. 1 is a block diagram of CSH wavefront sensor 100 according to an embodiment of the present invention. CSH wavefront sensor 100 includes a mask 102, sensor 104, and processing system 106, which includes microprocessor 108 and memory 110. Mask 102 is located in the foreground with respect to sensor 104, separated by a distance $z$. In one embodiment, mask 102 is a uniform random binary mask, and sensor 104 is a monochromatic sensor. In addition, the distance $z$ is small; for example, in one embodiment the distance $z$ may be set equal to approximately 1.6 millimeters (mm) However, in other embodiments, depending on the application the distance z may be selected within a wide range of distances to create the desired diffraction pattern (e.g., tenths of millimeters to centimeters).

The location of mask 102 modulates the incoming wavefront, whose local slopes are encoded as local movements of the diffraction pattern, which is then captured by sensor 104. In the embodiment shown in FIG. 1, a uniform random binary mask is utilized to modulate the incoming wavefront. However, in other embodiments, other types of masks may be utilized such as a non-uniform random, gray scale mask, a diffuser, or a wavelength--dependent mask, each capable of modulating the incoming light. For example, a non-uniform random mask may be utilized to create a specific diffraction pattern onto sensor 104. In still other embodiments, the type and or distance z the mask 102 is placed from the sensor 104 may depend on the wavelength of the light being captured. The captured image is a result of how the distorted wavefront is diffracted through the mask 102, and is provided to processing system 106 for processing. As described in more detail with respect to FIGS. 2a and 2b, measurement of the distorted wavefront requires first capturing the diffraction pattern of a planar wavefront which is utilized as a calibration or reference image. Subsequently, the diffraction pattern of a distorted wavefront is captured—designated as a measurement image. Given the reference image and the measurement image—the image pair, from which the local slope information of the distorted wavefront is numerically decoded.

In one embodiment, the accuracy of the CSH wavefront sensor is dependent, at least in part, on the distinctive diffraction pattern generated among neighbors, which in turn is determined in general by the mask 102 utilized, and the setup distance $z$ as well. However, the requirement for distinctiveness over neighbors must be weighed against practical issues of light-efficiency and fabrication easiness. In one embodiment, mask 102 utilizes a uniformly random pattern. However, in other embodiments the mask may be optimized to satisfy the distinctiveness requirements while maintaining the required light-efficiency and fabrication requirements. Also, in other embodiments the mask need not be binary, for example a greyscale mask, or a colored mask that is capable for wavelength-variant amplitude modulation, for the sake of specific applications.

In one embodiment, the distance $z$ is dependent on specific requirement. If the distance $z$ is too small, this results in a small diffraction of the mask, and thus weakens the distinctiveness between neighbors. This is best illustrated via a hypothetical in which the distance $z$ is reduced to zero, in which case the captured image is always equal to the mask pattern itself. In addition, if the distance $z$ is too small, then the warped displacement flow $z\nabla\phi(r)$ becomes too small and is non-sensible by the Horn-Schunck intensity preserving assumption, and is more vulnerable to the sensor pixel noise and quantization error. In contrast, a large $z$ value makes the CSH wavefront sensor physically bulky, and more diffractive is the unknown wavefront scalar field. This weakens our basic assumption that the unknown wavefront phase is of low-diffraction. Further, large $z$ value also enhances the diffraction of mask 102, and possibly leads to a low contrast diffraction pattern and thus weakens the distinctiveness between neighbors as well, consequently impair the wavefront sensing ability of the CSH.

Figure 2B:
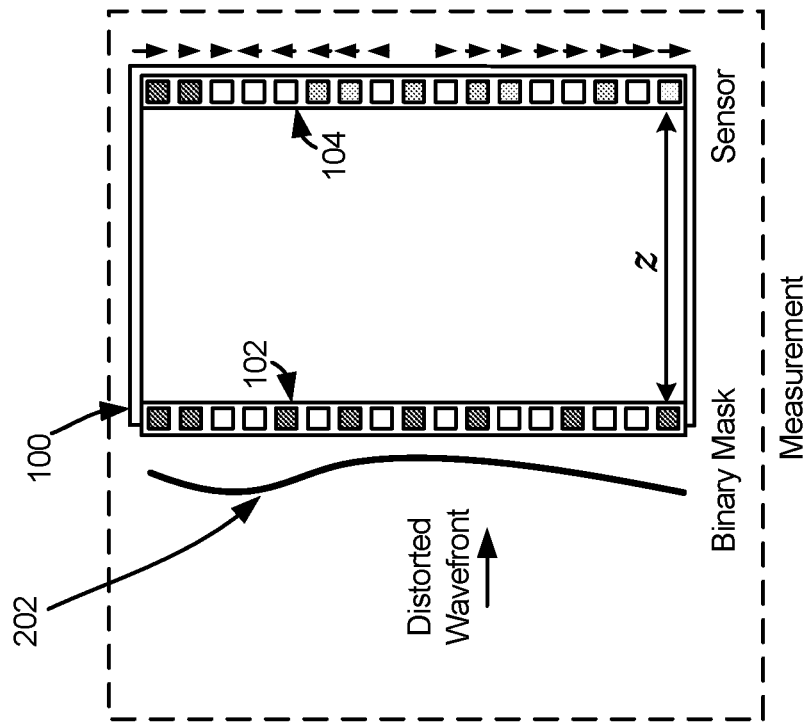
FIGS. 2a and 2b are block diagrams illustrating steps utilized to calibrate and utilize the CSH wavefront sensor according to an embodiment of the present invention.
Figure 2A:
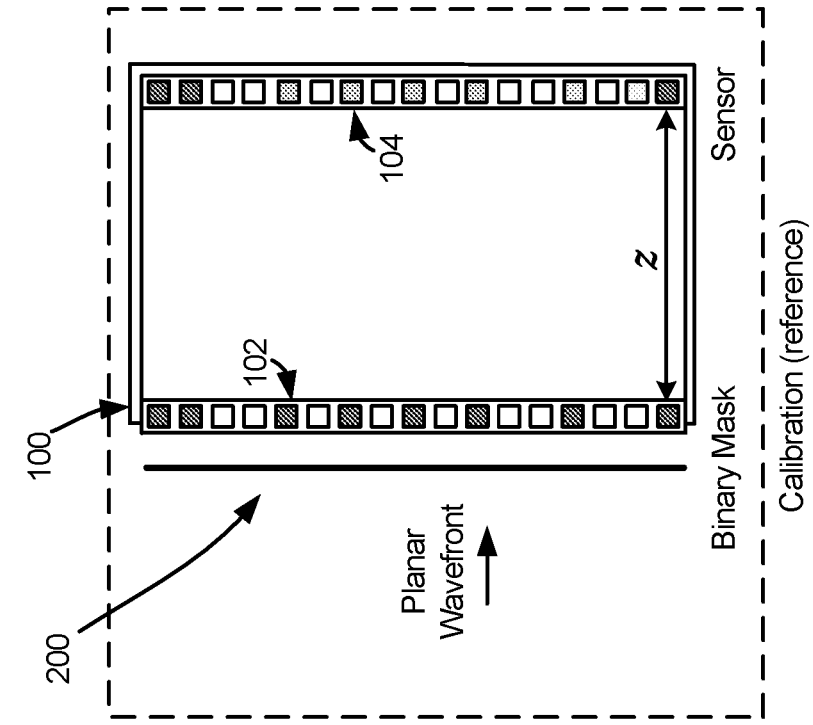

FIGS. 2a and 2b are block diagrams illustrating steps utilized to calibrate and utilize the CSH wavefront sensor according to an embodiment of the present invention. FIG. 2a illustrates the calibration step, in which planar wavefront 200 is provided to CSH wavefront sensor 100 to allow for the capturing of a reference image. In one embodiment the captured reference image is stored to memory 110. In one embodiment, the illumination source utilized to generate the planar wavefront is a collimated source. Once the reference image has been captured, CSH wavefront sensor 100 is ready to be utilized. An example of a captured reference image is illustrated in FIG. 3a, below.

FIG. 2b illustrates the measurement step, in which distorted wavefront 202 is provided to CSH wavefront sensor 100 to allow for the capturing of a measurement image. As discussed above, mask 102 is interpreted as modulating the incoming distorted wavefront 202. After propagating through a small distance $z$, the wavefront is encoded and then captured by sensor 104. Once again, in one embodiment the captured reference image is also stored to memory 110. Having captured the measurement image, processing system 106 compares the diffraction pattern of the reference image with the diffraction pattern of the measurement image. As discussed in more detail below, microprocessor 108 (shown in FIG. 1) utilized to compare the diffraction patterns may be implemented with a central processing unit (CPU) or a graphical processing unit (GPU). The GPU provides parallelism benefits over the CPU, and therefore may provide shorter execution times than the CPU. The measured difference between the two images results in sub-pixel shifting, which indicates the changes of local slopes. A benefit of this approach is that the measurement is independent of wavelength, so white incoherent illumination is sufficient and no coherent lights are needed.

The following derivation is provided to illustrate the feasibility of the above-identified CSH wavefront sensor. Consider a general scalar field $u_0(r)$ (coordinate $r=[x\ y]T$) with wave number $k=2\pi/\lambda$ at the mask position:

$$u_0(r) = p_0(r)f_0(r), \quad (1)$$

where $p_0(r)$ is the mask amplitude function (with sharp boundaries), $f_0(r)=\exp[j\phi(r)]$ is the scalar field with the distorted wavefront $\phi(r)$ representing the value to be measured. To simplify, the following assumptions are relied upon:

Mask $p_0(r)$ is of high frequency (and uniformly random binary), whose Fourier transform $P_0(\rho)$ (where $\rho$ is the Fourier dual of r) is broadband.

Distorted scalar field $f_0(r)$ is smooth enough such that its spectrum is bandlimited, and decays sufficiently enough to zero in high frequency regions. The wavefront $\phi(r)$ is of low-frequency, and is first-order differentiable.

Assuming the mask 102 is placed close to sensor 104 (shown in FIG. 1) (e.g., distance $z \approx 3$ mm), that the Huygens-Fresnel based principle is relied upon. Using a compact form of Rayleigh-Sommerfeld diffraction formula, and expanded into the Fourier domain, the diffractive scalar field may be expressed as follows:

$$u_z(r) = \quad (2)$$
$$\exp\left[jkz\left(1+\frac{\nabla^2}{k^2}\right)^{1/2}\right]u_0(r) \approx \int \exp(j2\pi r^T\rho)\exp\left[jkz(1-\lambda^2\|\rho\|_2^2)^{1/2}\right]$$
$$P_0(\rho) \times \exp(-jkz)\exp\left[jkz\left(1+\frac{\nabla^2}{k}\right)^{1/2}\right]f_0(r-\lambda z\rho)d\rho$$

Equation (2) may be further simplified by ignoring the diffraction of scalar field $f_0(r-\lambda z\rho)$. This is appropriate for the following reasons: (i) the distance $z$ is small, and the diffraction effect is not obvious, and (ii) distorted scalar field $f_0(r-\lambda z\rho)$ is smooth and its spectrum decays sufficiently fast, so its Laplacian matrix exponential expansion is very small and negligible as well. Consequently, the following approximation can be relied upon:

$$\exp\left[jkz\left(1+\frac{\nabla^2}{k^2}\right)^{1/2}\right] \approx \exp(jkz) \quad (3)$$

Subsequently, scalar field $f_0(r-\lambda z\rho)$ may be approximated by imposing Taylor expansion and linearizing $\phi(r-\lambda z\rho)$ around r, which yields:

$$f_0(r-\lambda z\rho) \approx \exp[j\phi(r)]\exp\left[-j2\pi\frac{z}{k}\rho^T\nabla\phi(r)\right]. \quad (4)$$

With these approximations, Eq. (2) can be simplified as:

$$u_z(r) = \exp[j\phi(r)]p_z\left(r-\frac{z}{k}\nabla\phi(r)\right) \quad (5)$$

where $p_z(r-(z/k)\nabla\phi(r))$ is the propagated diffractive scalar field of a linearly distorted mask $p_0(r-(z/k)\nabla\phi(r))$, predicted by the strict Rayleigh-Sommerfeld diffraction formula. It is worth noting that as indicated by Equation (5), in dispersion-negligible materials, $\phi(r)=ko(r)$ thus the resultant intensity is irrelevant to wave number k, indicating the possibility of using incoherent illumination for optical path measurements. In following contents no distinction is made between optical path and wavefront, and as a result $$o(r) = \frac{1}{k}\phi(r) = \phi(r).$$

CSH wavefront sensor is based on result provided by Eq. (5). The reference image is captured under collimated illumination (i.e., wherein $u_0(r)=p_0(r)$), such that equation (5) above is reduced to:

$$I_0(r)=|\mathcal{P}_z(r)|^2 \qquad (6)$$

which represents the diffraction pattern of the binary mask $p_0(r)$. The measurement image is captured under distorted illumination $f_0(r)$, such that equation (5) above is reduced to:

$$I_0(r)=|\mathcal{P}_z(r-z\nabla\phi(r))|^2=I_0(r-z\nabla\phi(r)) \qquad (7)$$

In this way, the local slope $\nabla\phi(r)$ is encoded in the diffraction pattern image pair $I_0(r)$ and $I(r)$, which can be solved in a number of different ways. For example, in one embodiment decoding involves utilizing a simple least squares method linearized around r (as described below). In another embodiment, an iterative nonlinear least squares updating using warping theory. After getting the wavefront slope $\nabla\phi(r)$, the unknown wavefront $\phi(r)$ can then be reconstructed by integrating over the previously obtained slopes.

In some embodiments, however, the distance $z$ is unknown and the displacements in the diffraction images pair depend on the physical scale of r. Therefore, under these conditions the reconstructed wavefront $\phi(r)$ can only be determined up to a scaled constant. In this embodiment, to correctly retrieve the wavefront $\phi(r)$, there is an additional constant that needs to be computed. One method of computing this scaling constant is to determine empirically in a least squares sense over all the wavefront samples against the ground truth wavefront (described in more detail below). In this way, the CSH wavefront sensor is regarded as a first-order sensing methods.

To numerically decode the hidden phase information of the CSH wavefront sensor, equation (7) is further linearized around r, as follows:

$$I(r)-I_0(r)\approx z(\nabla I_0(r))^T\nabla\phi(r) \qquad (8)$$

which represents the final image formation model that contains the wanted phase information $\phi(r)$. In this embodiment, phase information $\phi(r)$ is solved for directly. A benefit of this approach is that it takes advantage of the curl-free property of the flow, and allows for solving a joint optimization problem simultaneously.

In one embodiment, the decoding operation formulates the wavefront retrieval problem in discrete form. In this embodiment, let the total sensor pixel number be M, and the unknown wavefront $\phi\in\mathbb{R}^N$, where N>M includes unobserved boundary values. By defining image gradient fields $g_x\in\mathbb{R}^M$ and $g_y\in\mathbb{R}^M$ as the average x and y gradients of the reference image and measured image, and $g_t\in\mathbb{R}^M$ as the temporal gradient between the two, a concatenated matrix $G=[\text{diag}(g_x)\text{diag}(g_y)]\in\mathbb{R}^{M\times 2M}$ is obtained, where diag($\bullet$) denotes the diagonal matrix formed by the corresponding vector. The gradient operator is defined as $\nabla=[\nabla_x^T\nabla_y^T]^T$: $\mathbb{R}^N\to\mathbb{R}^{2N}$ where $\nabla_x$ and $\nabla_y$ are discrete gradient operators along x and y directions respectively. With a binary diagonal matrix $M_0\in\mathbb{R}_{\{0,1\}}^{2M\times 2N}$ denoting the measurement positions, and define $$M=\begin{bmatrix}M_o & 0 \\ 0 & M_o\end{bmatrix}\in\mathbb{R}_{\{0,1\}}^{2M\times 2N}, \text{ we have:} \qquad (9)$$

$$\underset{\phi}{\text{minimize}}\|GM\nabla\phi+g_t\|_2^2+\alpha\|\nabla\phi\|_2^2,$$

where the classical Horn-Schunck intensity consistency term is imposed, with a regularization term on the phase smoothness. The parameter $\alpha>0$ is a tradeoff parameter between the two terms. Exploiting proper splitting strategy, Eq. (9) can be efficiently solved using Alternating Direction Method of Multipliers (ADMM).

In one embodiment, a slack variable $w\in\mathbb{R}^{2N}$ is introduced to allow the original object function shown in Eq. (9) to be split into two parts, represented as:

$$\underset{\phi,w}{\text{minimize}} f(\phi)+g(w), \qquad (10)$$

$$\text{subject to } w=\nabla\phi$$

where the two functions $f(\bullet)$- and $g(\bullet)$ are defined as:

$$f:\mathbb{R}^N\to\mathbb{R}, f(\phi)=\alpha\|\nabla\phi\|_2^2$$

$$g:\mathbb{R}^{2N}\to\mathbb{R}, g(w)=\|GM\nabla\phi+g_t\|_2^2, \text{ with } w=\nabla\phi$$

Using the Alternating Direction Method of Multipliers (ADMM) yields Algorithm (1), where $\zeta\in\mathbb{R}^{2N}$ is the dual variable. The updating of $\phi$ and $w$ may be computed using the ADMM as follows:

Algorithm 1. ADMM for solving Eq. (10)

1: Initialize $w^0$ and $\zeta^0$, set $\lambda > 0$ and K
2: for k = 0, 1, ..., K − 1 do
3: $\phi^{k+1}\leftarrow\underset{\phi}{\text{argmin}} f(\phi)+\dfrac{1}{2\lambda}\|\nabla\phi-w^k+\zeta^k\|_2^2$
4: $w^{k+1}\leftarrow\text{prox}_{\lambda g}(\nabla\phi^{k+1}\zeta^k)$
5: $\zeta^{k+1}\leftarrow\zeta^k+\nabla\phi^{k+1}-w^{k-1}$
6: return $\phi^K$ (i) The $\phi$-Update Step In one embodiment, the $\phi$-update step (wavefront estimation) involves solving a Poisson equation, which usually requires proper boundary conditions in conventional approaches. However, in one embodiment, because of the existence of M, the unknown boundary values (i.e. the non-zero elements of $(I-M_0^T M_0)\phi$, where I is identity matrix) are implicitly determined by minimizing the objective. When trivial boundary conditions are assumed, the resultant Poisson equation solution leads to non-trivial boundary values on the observed part of wavefront $\phi$, which allows for the estimation $M_0\phi$. In some embodiments, the Neumann boundary condition suffices to yield a good estimation constrained to smallest possible N. In these embodiments, by just assuming Neumann boundary condition on the linear operators, denoting $\mathcal{F}_{DCT}$ and $\mathcal{F}Y_{DCT}^{-1}$ as forward and inverse Discrete Cosine Transforms (DCT) respectively, $\phi$-update is given by:

$$\phi^{k+1}=\underset{\phi}{\text{argmin}} \alpha\|\nabla\phi\|_2^2+\dfrac{1}{2\lambda}\|\nabla\phi-w^k+\zeta^k\|_2^2 \qquad (11)$$

$$=((2\lambda\alpha+1)\nabla^2)^{-1}\nabla^T(w^k+\zeta^k)$$

$$=\mathcal{F}_{DCT}^{-1}\left(\dfrac{\mathcal{F}_{DCT}(\nabla^T(w^k+\zeta^k))}{(2\lambda\alpha+1)\mathcal{F}_{DCT}(\nabla^2)}\right)$$

where the division is element-wise. Note that forward/inverse DCT can be efficiently implemented via forward/inverse Fast Fourier Transforms (FFT), respectively.

(ii) w-Update Step

In one embodiment, the w-update step (slack variable) involves the evaluation of $prox_{\lambda g}(u)$, the proximal operator of g(w) with parameter λ, which is defined and computed as:

$$prox_{\lambda g}(u) = \underset{w}{\operatorname{argmin}} \|GMw + g_t\|_2^2 + \frac{1}{2\lambda}\|w - u\|_2^2 \qquad (12)$$

$$= (I + 2\lambda M^T G^T GM)^{-1}(u - 2\lambda M^T G^T g_t)$$

$$= M^T(I + 2\lambda G^T G)^{-1}(Mu - 2\lambda G^T g_t) +$$

$$(I - M^T M)u$$

wherein $I+2\lambda G^T G$ is diagonal in blocks and whose inverse is also diagonal in blocks and in closed-form, so is $prox_{\lambda g}(u)$. In this embodiment, the computation of $prox_{\lambda g}(u)$ is element-wise. In one embodiment, to suppress noise, a median filtering is imposed to the final gradient estimation. In one embodiment, the estimated wavefront $\phi_{estimate}$ is computed by solving Eq. (11), with median filtered $(w^K+\zeta^K)$. In this embodiment, $M_0\phi_{estimate}$ is used as the final output wavefront.

One of the benefits of the described decoding process is the ability to execute the decoding process in a highly efficient and parallelizable manner For example, the update step described above exploits Fast Fourier Transform (FFT) operations, element-wise operation, or simple convolutions. In addition, in one embodiment processing system 106 (shown in FIG. 1) utilizes GPU to perform the FFT operations. In one embodiment, the CUDA and CuFFT library is utilized to execute FFT operations, and the unknown size N is set to a power of two. Given the actual pixel number M, the unknown size N can be defined arbitrarily as long as N>M, and hence is well suited for numerical implementations. In one embodiment, utilization of N−M~10 is utilized, although in other embodiment other value of N may be utilized.

Figure 5:
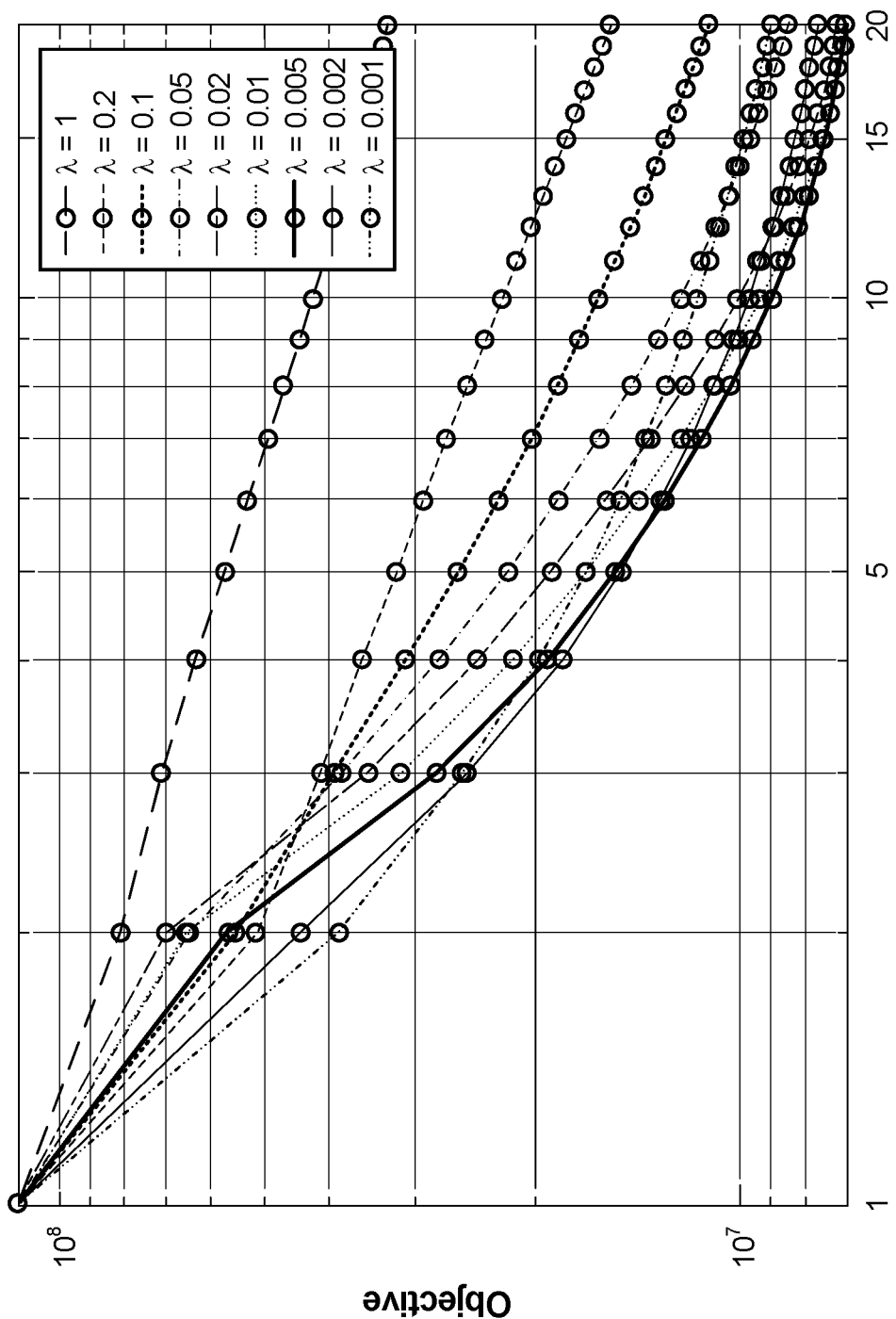
FIG. 5 is a graph indicating how proximal parameter $\lambda$ affects convergence of the algorithm according to an embodiment of the present invention.

Several of the parameters described above may be modified, with each modification affecting the subsequent influence on the convergence speed of the decode algorithm For example, in one embodiment the proximal parameter λ determines, at least in part, the convergence speed of the ADMM algorithm shown in FIG. 5.

Figure 3:
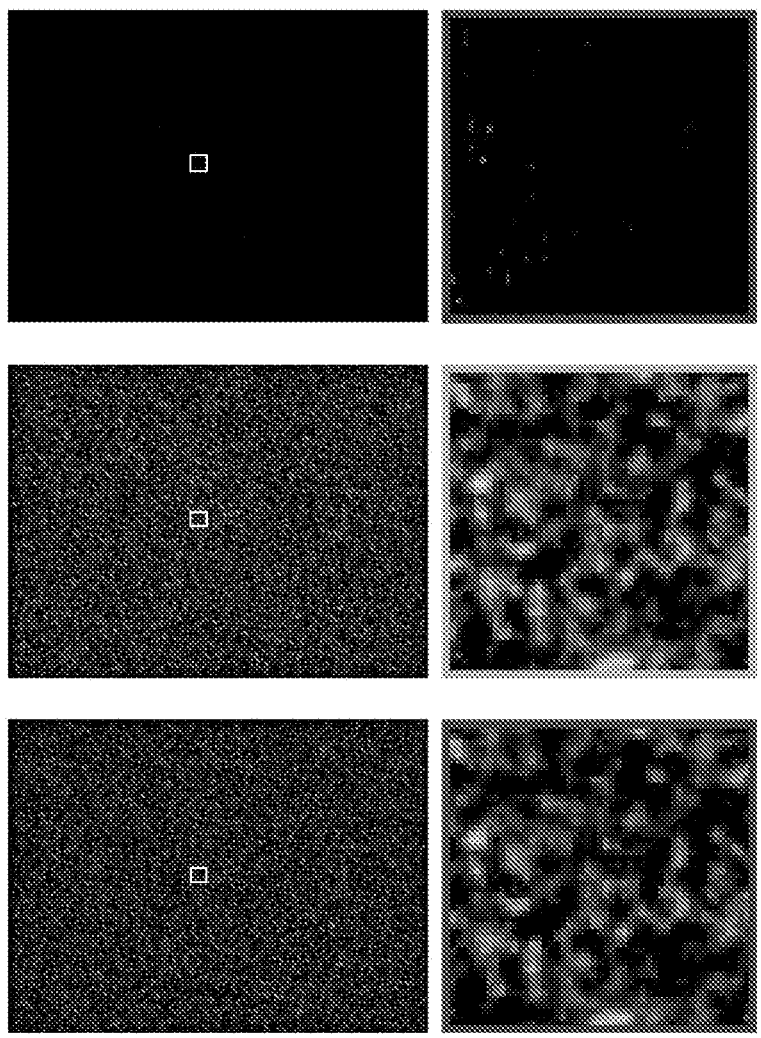
FIG. 3 illustrates the capture of a planar/reference wavefront image, a distorted/measurement wavefront image, and the difference between the reference wavefront image and the measurement wavefront image.

FIG. 3 illustrates the capture of a planar/reference wavefront image, a distorted/measurement wavefront image, and the difference between the reference wavefront image and the measurement wavefront image. In particular, the images on the left illustrate a captured reference image, wherein the top portion illustrates the entire captured image and the bottom portion illustrates a magnified view of the top portion. The images in the center illustrate a captured measurement image, wherein the top portion illustrates the entire captured image and the bottom portion illustrates a magnified view of the top portion. The images on the right illustrate the difference between the captured reference image and the captured measurement image. The difference between the reference image and the measurement image illustrates the local shifting of the diffraction pattern as a result of the distorted wavefront. In this way, FIG. 3 illustrates the necessity of capturing a reference image based on a planar wavefront in order to prepare the wavefront sensor for capture.

Figure 4:
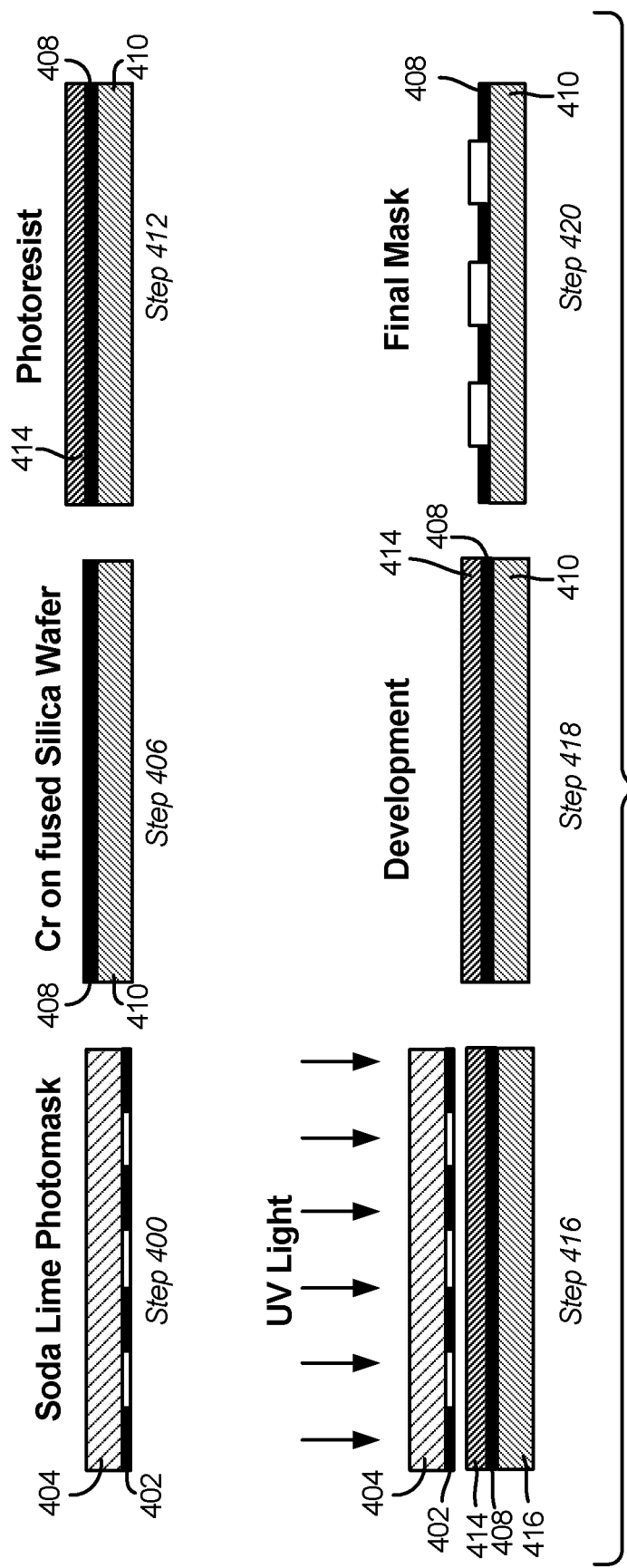
FIG. 4 illustrate fabrication of the mask (a binary one, in this case) utilized by the wavefront sensor according to an embodiment of the present invention.

FIG. 4 illustrates fabrication of a binary mask utilized by the wavefront sensor according to an embodiment of the present invention. At step 400, mask pattern 402 is written to a first side of photomask 404. In this embodiment, photomask 404 is a Soda Lime photomask, but in other embodiments various other well-known types of photomasks may be utilized. In addition, in this embodiment a laser direct writer is utilized to write mask pattern 402 onto the first side of photomask 404.

At step 406, a thin layer 408 is deposited onto a side of wafer 410. In the embodiment shown in FIG. 4, thin layer 408 is a chromium (Cr) layer is deposited onto a translucent substrate 410. In one embodiment, translucent substrate 410 is a fused silica wafer, but in other embodiments other types of translucent substrates could be utilized. In one embodiment, the translucent substrate may be completely transparent.

At step 412, a uniform photoresist layer 414 is deposited on top of the thin layer 408. In one embodiment, a spin-coating method is utilized to deposit the photoresist layer onto thin layer 408.

At step 416, wafer 410 is aligned with photomask 404 on a contact aligner and the photoresist layer 414 is exposed to UV light. Depending on the type of photoresist layer utilized (positive or negative), either the areas exposed to UV light become soluble to the photoresist developer or the areas exposed to the UV light become insoluble to the photoresist developer.

At step 418, a development solution is utilized to either remove areas exposed to UV light at step 416 or remove areas unexposed to UV light at step 416.

At step 420, an etching process is utilized to etch portions of thin layer 408. Having etched the exposed portions of thin layer 408, remaining photoresist is removed, leaving the final binary mask formed on fused silica wafer 410.

Accuracy of a proposed Coded Shack-Hartmann wavefront sensor is provided based on experimental results. The experimental setup relies on generation of a plurality of different target wavefronts. In this embodiment, target wavefronts are generated using a reflective LCoS-based Spatial Light Modulator (SLM) (e.g., PLUTO SLM by HOLOEYE) having a pixel pitch of approximately 8 μm, and the maximum phase retardation of 2π. For collimated illumination, a faraway white point light source is employed, along with a polarizer placed in the optical path to allow for phase-only modulation of the SLM. A beamsplitter is employed, along with a Kepler telescope configuration utilized to ensure the SLM and wavefront sensor are in conjugate, to ensure that the distorted wavefront measured by the CSH wavefront sensor is the one produced by the SLM. In this experiment, the Kepler telescope is composed of two lenses, with focal lengths of 100 mm and 75 mm, respectively. The sensor exposure time is set to be 5 ms in both calibration and measurement steps.

Using the above mentioned optical setup, four types of wavefront samples were generated and acquired, each with a series of different scales: (i) cubic phases, (ii) spherical phases, (iii) single-mode Zernike phases, and (iv) customized Zernike phases. Each of these wavefronts are analyzed to determine how parameters may be tuned to measure and detect the desired wavefront, as well as the tradeoff expected between execution time and accuracy of the detected wavefront.

Tuning of Proximal Parameter λ

FIG. 5 is a graph indicating how proximal parameter λ affects convergence of the algorithm according to an embodiment of the present invention. Tuning of proximal parameter λ determines the convergence speed of the ADMM algorithm. In one experiment, proximal parameter λ is evaluated for a fixed iteration number K=20, using the spherical wavefront data. Results are provided in FIG. 5, in which a plurality of values of proximal parameter λ are evaluated. As illustrated in FIG. 5, a large value of proximal parameter λ makes the problem stiff and therefore convergences slowly, while a smaller value of proximal parameter λ slows the convergence when iterations increase because of a lack of constraint. In this experiment, a suitable choice of proximal parameter λ lies in the range of (0.002, 0.02), with a value of λ=0.01 being utilized herein.

Tradeoff Between Time and Accuracy

In addition to the proximal parameter 2, there is also a tradeoff between time and accuracy of the decoding algorithm. For example, to suppress noise, a median filtering on the estimated gradients is imposed at the last step. In practice, a median filtered final gradient estimation could indeed benefit for a smoother reconstructed wavefront. In addition, lower energy, in this case in the form of a large number of iterations and more computation time, does not equivalently yield better results. On the other hand, the original energy function may not converge sufficiently if given inadequate number of iterations. Consequently, it is necessary to investigate the tradeoff between time and accuracy. In one embodiment, a value of K=10 yields a good tradeoff.

Scaling Constant

As mentioned before, a scaling constant is also computed. In one embodiment, the scaling constant is determined by way of (i) mean normalization on the reconstructed wavefront; (ii) comparing with ground truth and determining a suitable scaling constant for each pixel position, (iii) getting the median as the scaling constant for each individual wavefront reconstruction, (iv) and obtaining the final scaling constant as the mean of the medians in step (iii). In one embodiment, an estimation for the scaling constant is set to 0.25.

Figure 6:
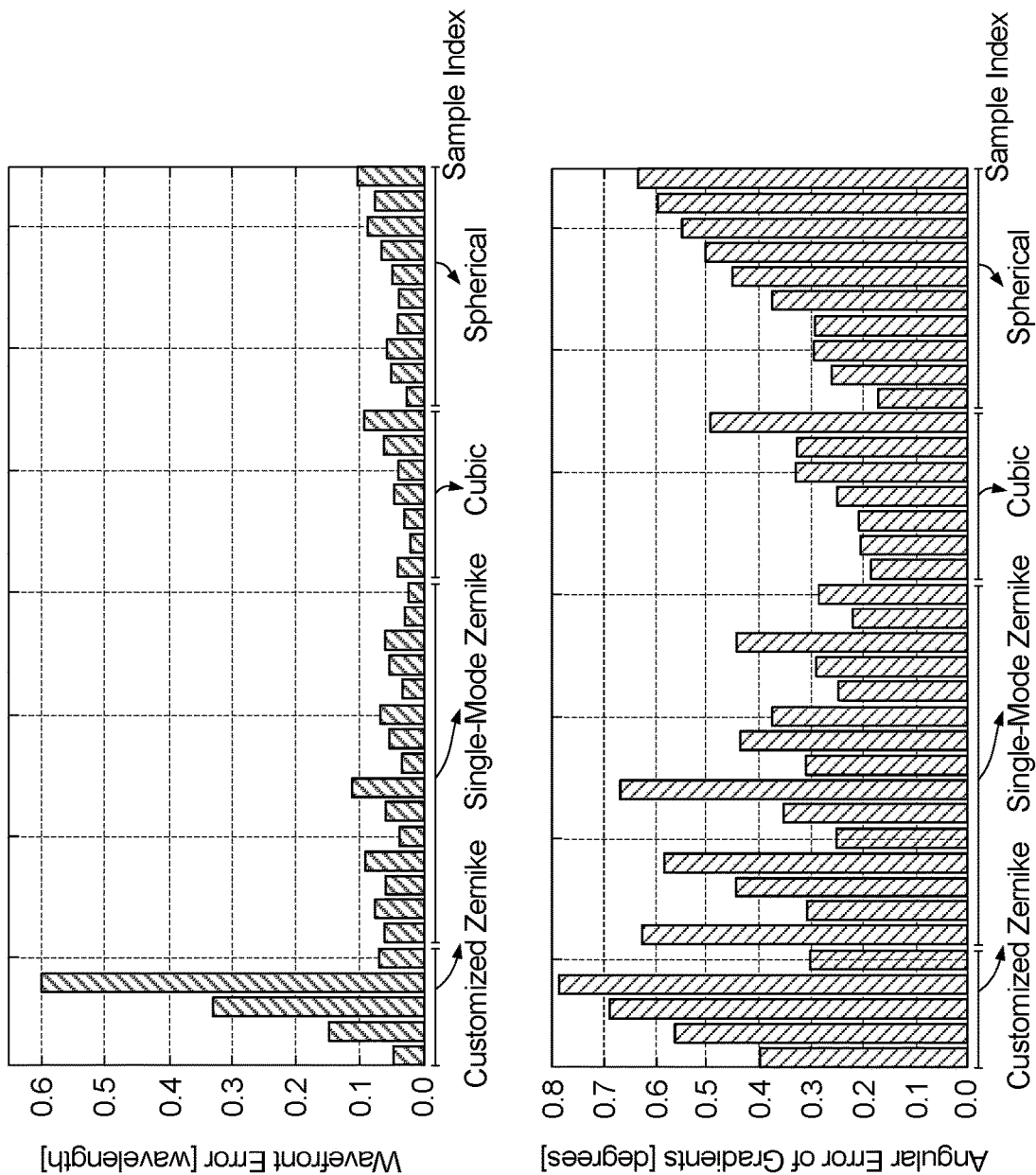
FIG. 6 are graphs that illustrate the accuracy of the CSH wavefront sensor according to an embodiment of the present invention.

FIG. 6 are graphs that illustrate the accuracy of the CSH wavefront sensor according to an embodiment of the present invention. The top graph illustrates mean absolute error of all sample wavefronts. The bottom graph illustrates average angular error of all the sample wavefront gradients. As illustrated in the top graph, for most wavefront samples, the mean absolute error is less than 0.1 wavelengths, which is ~50 nm if monochromatic green light is considered. This illustrates that the CSH wavefront sensor is highly sensitive.

In addition to good error performance, the CSH wavefront sensor provides efficient run-time operation. In one embodiment, the run-time of the wavefront reconstruction algorithm is mainly reduced by reducing the required number of iterations. For example, in one embodiment the first iteration or update of the wavefront $\phi$ may be skipped when slack variable $w^0$ and $\zeta^0$ are set to zero vectors.

The present invention provides a wavefront sensor utilized to measure the phase of distorted wavefronts. In one embodiment, the wavefront sensor described herein as a Coded Shack-Hartmann wavefront sensor utilizes in a foreground mask that is utilized to modulate the incoming wavefront at diffraction scale. The resulting wavefront information is encoded by the diffraction pattern, and is numerically decoded by a wavefront reconstruction algorithm that relies on a simple optimization method. In this way, the Coded Shack-Hartmann wavefront sensor provides higher pixel utilization, full sensor resolution wavefront reconstruction, and efficient parallel computation and real-time performance as compared with traditional wavefront sensors such as the traditional Shack-Hartmann wavefront sensor.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A wavefront sensor comprising:
    a foreground mask that modulates an incoming wavefront to create a diffraction pattern, wherein the foreground mask is a uniform random binary mask; and
    a sensor located behind the foreground mask that captures the diffraction pattern generated as a result of modulation of the incoming wavefront by the foreground mask.

2. The wavefront sensor of claim 1, wherein the foreground mask is located a distance $z$ in front of the sensor.

3. The wavefront sensor of claim 2, wherein the distance $z$ is selected based on the application to create a desired diffraction pattern.

4. The wavefront sensor of claim 2 wherein the distance $z$ has a range of between 0.1 millimeters to 3.0 millimeters.

5. The wavefront sensor of claim 1, further comprising:
    a processor configured to compare a diffraction pattern of a reference image captured in response to a planar wave incident on the sensor with a diffraction pattern of a measurement image captured in response to a distorted wavefront incident on the sensor.

6. The wavefront sensor of claim 5, wherein the processor measures local sub-pixel shifts between the reference image and the measurement image and utilizes these local sub-pixel shifts to detect local slopes of the distorted wavefront.

* * * * *